United States Patent
Kaynak et al.

(10) Patent No.: US 10,193,577 B2
(45) Date of Patent: Jan. 29, 2019

(54) STOPPING CRITERIA FOR LAYERED ITERATIVE ERROR CORRECTION

(71) Applicant: Micron Technology, Inc., Boise, ID (US)

(72) Inventors: Mustafa N. Kaynak, San Diego, CA (US); William H. Radke, Los Gatos, CA (US); Patrick R. Khayat, San Diego, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 14/811,339

(22) Filed: Jul. 28, 2015

(65) Prior Publication Data

US 2015/0333774 A1    Nov. 19, 2015

Related U.S. Application Data

(63) Continuation of application No. 13/746,768, filed on Jan. 22, 2013, now Pat. No. 9,116,822.

(Continued)

(51) Int. Cl.
*H03M 13/37* (2006.01)
*G06F 11/10* (2006.01)
(Continued)

(52) U.S. Cl.
CPC ......... *H03M 13/3753* (2013.01); *G06F 11/10* (2013.01); *G06F 11/1012* (2013.01);
(Continued)

(58) Field of Classification Search
CPC ... H04L 1/0009; H04L 1/0057; H04L 1/0041; H04L 1/0071; H03M 13/35;
(Continued)

(56) References Cited

U.S. PATENT DOCUMENTS 5,379,415 A * 1/1995 Papenberg ............ G06F 11/106
714/5.11
6,108,152 A * 8/2000 Du ........................ G11B 19/04
360/40

(Continued)

FOREIGN PATENT DOCUMENTS

CN    101194428    6/2008
CN    101681281    3/2010

(Continued)

OTHER PUBLICATIONS

Notice of Rejection for related Korea Patent Application No. 10-2015-7017461, dated Feb. 22, 2016, 16 pages.

(Continued)

*Primary Examiner* — Albert Decady
*Assistant Examiner* — Enam Ahmed
(74) *Attorney, Agent, or Firm* — Brooks, Cameron & Huebsch, PLLC (57) ABSTRACT

The present disclosure includes apparatuses and methods related to stopping criteria for layered iterative error correction. A number of methods can include receiving a codeword with an error correction circuit, iteratively error correcting the codeword with the error correction circuit including parity checking the codeword on a layer-by-layer basis and updating the codeword after each layer. Methods can include stopping the iterative error correction in response to a parity check being correct for a particular layer.

28 Claims, 4 Drawing Sheets

Related U.S. Application Data (60) Provisional application No. 61/734,473, filed on Dec. 7, 2012.

(51) Int. Cl.
  *G11C 29/52* (2006.01)
  *H03M 13/11* (2006.01)
  *H03M 13/29* (2006.01)
  H03M 13/15 (2006.01)

(52) U.S. Cl.
  CPC .......... *G06F 11/1068* (2013.01); *G11C 29/52* (2013.01); *H03M 13/114* (2013.01); *H03M 13/116* (2013.01); *H03M 13/1111* (2013.01); *H03M 13/1128* (2013.01); *H03M 13/2906* (2013.01); *H03M 13/3707* (2013.01); *H03M 13/1108* (2013.01); *H03M 13/152* (2013.01); *H03M 13/1515* (2013.01)

(58) Field of Classification Search
  CPC ......... H03M 13/3753; H03M 13/3707; H03M 13/116; H03M 13/114; H03M 13/1128; H03M 13/2906; H03M 13/1111; H03M 13/1108; H03M 13/152; H03M 13/1515; G06F 11/1068; G06F 11/1012; G06F 11/10; G11C 29/52
  USPC .......................................................... 714/774
  See application file for complete search history.

(56) References Cited

U.S. PATENT DOCUMENTS

| | | | |
|---|---|---|---|
| 6,457,862 B1* | 10/2002 | Sumii | G01N 23/207 378/208 |
| 6,526,531 B1 | 2/2003 | Wang | |
| 6,751,771 B2 | 6/2004 | Chuang et al. | |
| 6,981,198 B2* | 12/2005 | Boyer | G06F 11/1008 714/774 |
| 7,502,254 B2 | 3/2009 | Murin et al. | |
| 7,814,401 B2 | 10/2010 | Alrod et al. | |
| 7,904,795 B2 | 3/2011 | Liao et al. | |
| 7,954,004 B2 | 5/2011 | Li | |
| 7,966,505 B2 | 6/2011 | Gao et al. | |
| 8,059,763 B1 | 11/2011 | Varnica et al. | |
| 8,065,583 B2 | 11/2011 | Radke | |
| 8,065,598 B1 | 11/2011 | Gunnam et al. | |
| 8,125,826 B2 | 2/2012 | Radke | |
| 8,166,379 B1 | 4/2012 | Wu et al. | |
| 8,171,367 B2 | 5/2012 | Gao et al. | |
| 8,190,962 B1 | 5/2012 | Chen et al. | |
| 8,243,511 B2 | 8/2012 | Patapoutian et al. | |
| 8,291,283 B1* | 10/2012 | Rad | H03M 13/036 714/752 |
| 8,640,010 B2 | 1/2014 | Miyauchi et al. | |
| 8,650,457 B1 | 2/2014 | Yeo | |
| 8,869,005 B2 | 10/2014 | Jeddeloh | |
| 8,880,987 B2 | 11/2014 | Sharon et al. | |
| 8,966,339 B1* | 2/2015 | Lu | H03M 13/1117 714/758 |
| 8,984,376 B1* | 3/2015 | Norrie | H03M 13/114 714/772 |
| 8,996,957 B1* | 3/2015 | Northcott | G06F 11/1012 714/763 |
| 9,564,922 B1* | 2/2017 | Graumann | H03M 13/1142 |
| 2001/0050926 A1* | 12/2001 | Kumar | H04H 20/30 370/529 |
| 2007/0089018 A1 | 4/2007 | Tang et al. | |
| 2007/0136641 A1* | 6/2007 | Juluri | G11B 20/1833 714/769 |
| 2008/0098279 A1 | 4/2008 | Dimou | |
| 2008/0148125 A1* | 6/2008 | Bhora | H04L 1/0051 714/755 |
| 2008/0163026 A1 | 7/2008 | Varnica et al. | |
| 2008/0244359 A1 | 10/2008 | Li et al. | |
| 2009/0193313 A1 | 7/2009 | Kong et al. | |
| 2009/0249163 A1* | 10/2009 | Ovchinnikov | H03M 13/2972 714/755 |
| 2009/0271688 A1 | 10/2009 | Jiang et al. | |
| 2009/0327832 A1* | 12/2009 | Ichihara | G11B 20/1833 714/752 |
| 2010/0034018 A1 | 2/2010 | Yang et al. | |
| 2010/0077275 A1* | 3/2010 | Yu | H03M 13/114 714/752 |
| 2010/0205515 A1 | 8/2010 | Yang et al. | |
| 2010/0211841 A1* | 8/2010 | Cao | H03M 13/1102 714/748 |
| 2010/0275088 A1 | 10/2010 | Graef | |
| 2011/0029756 A1 | 2/2011 | Biscondi et al. | |
| 2011/0167305 A1 | 7/2011 | Haratsch et al. | |
| 2011/0093652 A1 | 8/2011 | Sharon et al. | |
| 2011/0209029 A1 | 8/2011 | Zopf | |
| 2011/0209031 A1 | 8/2011 | Kim et al. | |
| 2011/0214029 A1 | 9/2011 | Steiner et al. | |
| 2011/0231738 A1 | 9/2011 | Horisaki | |
| 2011/0246849 A1 | 10/2011 | Rault et al. | |
| 2011/0246855 A1 | 10/2011 | Cheng et al. | |
| 2011/0246859 A1 | 10/2011 | Haratsch et al. | |
| 2011/0320902 A1 | 12/2011 | Gunnam et al. | |
| 2012/0079355 A1 | 3/2012 | Patapoutian et al. | |
| 2012/0173951 A1* | 7/2012 | Kong | H03M 13/1515 714/755 |
| 2012/0173954 A1 | 7/2012 | Yamagishi | |

FOREIGN PATENT DOCUMENTS

| | | |
|---|---|---|
| CN | 102687121 | 9/2012 |
| JP | 2002353821 | 12/2002 |
| JP | 2008257842 | 10/2008 |
| JP | 2008544721 | 12/2008 |
| JP | 2009152654 | 7/2009 |
| JP | 2011197957 | 10/2011 |
| JP | 2012182623 | 9/2012 |
| WO | 2007/068554 | 6/2007 |
| WO | 2011113034 | 9/2011 |

OTHER PUBLICATIONS

Office Action for related Japan Patent Application No. 2015-545908, dated Feb. 23, 2016, 11 pages.

Lou, et al., "Increasing Storage Capacity in Multilevel Memory Cells by Means of Communications and Signal Processing Techniques," Abstract 1 pg., Aug. 2000, vol. 147, Issue 4, Circuits, Devices and Systems, IEE Proceedings.

Ningde Xie, et al., Concatenated Low-Density Party-Check and BCH Coding System for Magnetic Recording Read Channel with 4 kB Sector Format, IEEE Transactions on Magnetics, Dec. 2008, pp. 4784-4789, vol. 44, Issue 12.

International Search Report and Written Opinion for related PCT Application No. PCT/US2013/073836, dated Mar. 20, 2014, 10 pages.

Search Report and Written Opinion for related EP Patent Application No. 13860402.0, dated Jul. 28, 2016, 15 pages.

Roth et al., "A 15.8 pJ/bit/iter Quasi-Cyclic LDPC Decoder for IEEE 802.11n in 90 nm CMOS", Nov. 8-10, 2010, (4 pgs.), IEEE Asian Solid-State Circuits Conference, pp. 1-4.

Zhao et al., "A BER Performance-Aware Early Termination Scheme for Layered LDPC Decoder", Oct. 6-8, 2010, (4 pgs.), IEEE Workshop on Signal Processing Systems, pp. 416-419.

Hocevar, Dale E., "A Reduced Complexity Decoder Architecture via Layered Decoding of LDPC Codes", Oct. 13, 2004, (6 pgs.), IEEE Workshop on Signal Processing Systems, pp. 107-112.

Takeshita et al., "On the Frame-Error Rate of Concatenated Turbo Codes", Apr. 1, 2001, (7 pgs.), vol. 49, No. 4, IEEE Transactions on Communications, pp. 602-608.

Office Action for related China Patent Application No. 201380070923.8, dated Feb. 4, 2017, 14 pages.

(56) References Cited

OTHER PUBLICATIONS

EPO Communication Pursuant to Article 94(3) EPC, dated Nov. 3, 2017, 9 pages.

* cited by examiner

STOPPING CRITERIA FOR LAYERED ITERATIVE ERROR CORRECTION

PRIORITY INFORMATION

This application is a Continuation of U.S. application Ser. No. 13/746,768, filed Jan. 22, 2013, which claims priority to U.S. Provisional Application No. 61/734,473, filed Dec. 7, 2012, the contents of which are herein incorporated by reference.

TECHNICAL FIELD

The present disclosure relates generally to semiconductor memory and methods, and more particularly, to apparatuses and methods related to stopping criteria for layered iterative error correction.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error information, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is utilized as volatile and non-volatile data storage for a wide range of electronic applications. Non-volatile memory may be used in portable electronic devices, such as laptop computers, portable memory sticks, digital cameras, cellular telephones, portable music players such as MP3 players, movie players, and other electronic devices. Memory cells can be arranged into arrays, with the arrays being used in memory devices.

One type of error correction involves low density parity check (LDPC) codes. Unencoded (e.g., "raw") data can be encoded into codewords for transmission and/or storage. The codewords can subsequently be decoded to recover the data. Powerful error correction may be desired but balanced against latency, throughput, and/or power constraints such as those imposed by portable electronic devices.

DETAILED DESCRIPTION

The present disclosure includes apparatuses and methods related to stopping criteria for layered iterative error correction. A number of methods can include receiving a codeword with an error correction circuit, iteratively error correcting the codeword with the error correction circuit including parity checking the codeword on a layer-by-layer basis and updating the codeword after each layer. Methods can include stopping the iterative error correction in response to a parity check being correct for a particular layer.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "M", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1:
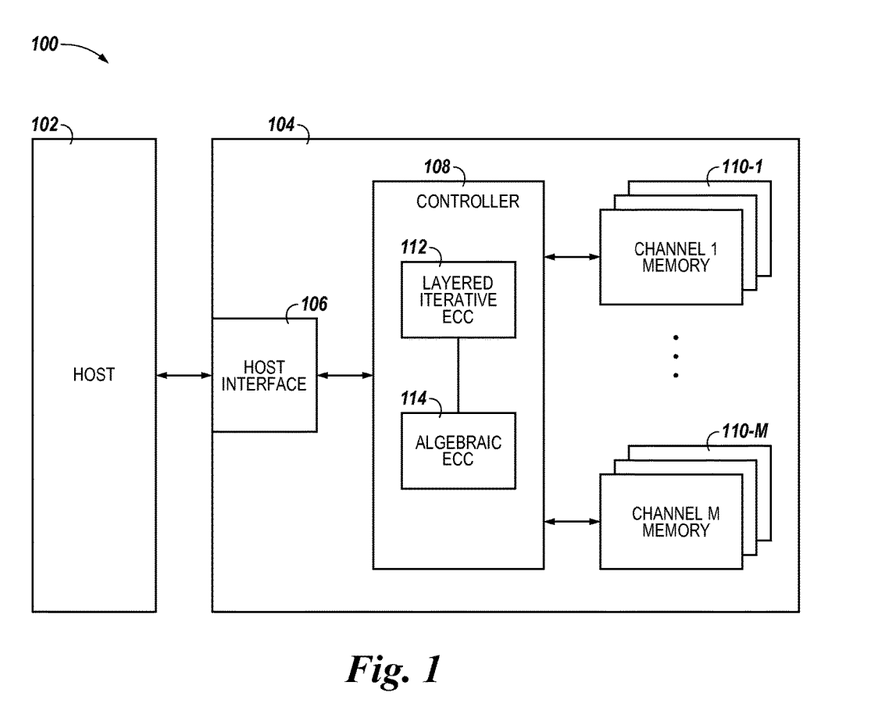
FIG. 1 is a block diagram of an apparatus in the form of a computing system including at least one memory system in accordance with a number of embodiments of the present disclosure.

FIG. 1 is a block diagram of an apparatus in the form of a computing system 100 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, ..., 110-M (e.g., solid state memory devices such as NAND Flash devices), which provide a storage volume for the memory system 104. The number of memory devices 110-1, ..., 110-M may be referred to generally herein as memory device 110. In another embodiment, the memory system 104 may be a single memory device.

As illustrated in FIG. 1, the controller 108 can be coupled to the host interface 106 and to the memory device 110 via a plurality of channels and can be used to send data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

The host 102 can be a host system such as a personal laptop computer, a desktop computer, a digital camera, a mobile telephone, or a memory card reader, among various other types of hosts. The host 102 can include a system motherboard and/or backplane and can include a number of memory access devices (e.g., a number of processors). The host 102 can also be a memory controller, such as where memory system 104 is a memory device (e.g., having an on-die controller).

The controller 108 can communicate with the memory device 110 (which in some embodiments can be a number of memory arrays on a single die) to control data read, program verify, write, and erase operations, among other operations. In some embodiments, the controller 108 can be on the same die or a different die than any or all of the number of memory devices 110-1, ..., 110-M.

Although not specifically illustrated, in some embodiments, the controller 108 can include a discrete memory channel controller for each channel coupling the controller 108 to the memory devices 110-1, ..., 110-M. The controller 108 can include, for example, a number of components in the form of hardware and/or firmware (e.g., one or more integrated circuits) and/or software for controlling access to the number of memory devices 110-1, ..., 110-M and/or for facilitating data transfer between the host 102 and memory devices 110-1, ..., 110-M.

The number of memory devices 110-1, ..., 110-M can include a number of arrays of memory cells (e.g., non-volatile memory cells). The arrays can be Flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory (e.g., memory devices 110-1, ..., 110-M of system 104) as a page of data, for example. As such, a page of data can be referred to as a data transfer size of the memory system. Data can be transmitted to/from a host (e.g., host 102) in data segments referred to as sectors (e.g., host sectors). As such, a sector of data can be referred to as a data transfer size of the host.

As illustrated in FIG. 1, the controller 108 can include an iterative error correction circuit 112 ("Layered Iterative ECC") coupled to an algebraic error correction circuit 114 ("Algebraic ECC"). The iterative error correction circuit 112 can be coupled to the memory device 110 and the algebraic error correction circuit 114 can be coupled to the host interface 106. For example, the iterative error correction circuit 112 can be a quasi-cyclic low density parity check (LDPC) code circuit, among other iterative error correction circuits that apply layered iterative error correction. Although illustrated as a single circuit, the iterative error correction circuit 112 can be provided as a separate encoding circuit (e.g., for encoding data to be stored in the memory device 110) and decoding circuit (e.g., for decoding data stored in the memory device 110). The algebraic error correction circuit 114 can be one of the group including a Bose-Chaudhuri-Hocquenghem (BCH) error correction circuit, and a Reed Solomon error correction circuit, among other algebraic error correction circuits. Although illustrated as a single circuit, the algebraic error correction circuit 114 can be provided as a separate encoding circuit (e.g., for encoding data to be stored in the memory device 110) and decoding circuit (e.g., for decoding data stored in the memory device 110). Each of the iterative error correction circuit 112 and the algebraic error correction circuit 114 can be discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, each of the iterative error correction circuit 112 and the algebraic error correction circuit 114 can be external to the controller 108 or have a number of components located within the controller 108 and a number of components located external to the controller 108.

The iterative error correction circuit 112 can be configured to receive a codeword from the memory device 110. In a number of embodiments, the iterative error correction circuit 112 can receive the codeword, which can be comprised of hard data read from the memory device 110, without receiving soft data. In a number of embodiments, the iterative error correction circuit 112 can receive the codeword comprising hard data and can receive soft data corresponding to the codeword therewith. In a number of embodiments, the iterative error correction circuit 112 can receive the codeword comprising hard data and can separately receive soft data corresponding to the codeword (e.g., where the soft data is received based on a separate soft read of the codeword or where the soft data was originally read with the hard data, buffered, and received from the buffer). Hard data is data that corresponds to the data state of a memory cell. For example, a 2-bit memory cell can be programmed to one of four data states, where each data state corresponds to one of data 00, 01, 10, or 11. In contrast, soft data associated with a memory cell can indicate a location of a state (e.g., threshold voltage (Vt)) stored on the memory cell within a distribution of states (e.g., Vt distribution) representing the target state to which the memory cell was programmed. Soft data corresponding to a codeword (where the codeword is comprised of hard data) can include soft data that corresponds to the hard data in the codeword (e.g., the soft data can indicate a greater resolution of the hard data in the codeword). A memory device can be configured to determine a particular number of soft data bits for hard data read therefrom. For the 2-bit memory cell described above, an example of soft data could include a greater resolution that uses four bits, which could otherwise represent up to sixteen different states. The resolution of the soft data can depend on the number of reads made to locate the Vt stored on the memory cell for those embodiments employing discrete read signals, where more reads can provide greater resolution. For those embodiments employing a ramping read signal, the resolution of the soft data can depend on a resolution provided as an output from an analog-to-digital converter or other circuitry that correlates a value of the Vt of the memory cell to data, where the resolution is reflected by the number of bits transmitted across an input/output (I/O) bus from the memory device 110. For example, a memory device 110 can be configured to read a particular memory cell that stores two bits of data with a resolution of eight bits and to transfer anywhere from two bits (two bits of hard data and zero bits of soft data) to eight bits (two bits of hard data and six bits of soft data) across an I/O bus.

The iterative error correction circuit 112 can iteratively error correct the codeword by parity checking the codeword on a layer-by-layer basis and updating the codeword after each layer. One iteration of error correction performed by the iterative error correction circuit 112 can include more than one parity checking layer. The iterative error correction circuit 112 can use an iterative belief propagation decoder, where the iterative error correction circuit 112 can include two types of processing nodes: variable nodes and check nodes. The processing nodes can be coupled according to the LDPC code's parity check matrix. The check nodes can be implemented as circuits that parity check (e.g., perform a syndrome check) and/or update the codeword. In a number of embodiments, updating the codeword can include updating reliability data (e.g., a log-likelihood ratio (LLR)), among other functions. For example, updating the reliability data associated with each variable node can cause a value of a respective bit of the codeword that is associated with each variable node to be updated (e.g., where updating a bit of the codeword includes changing a value of the bit or holding the value of the bit). Thus, updating the reliability data effectively updates the codeword. For embodiments that include receiving hard data without soft data and/or reliability data (e.g., based on hard data reads), reliability data can be assigned to the codeword based, at least in part, on the LDPC code's parity check constraints during the decoding process. For embodiments that include receiving hard data with soft data (e.g., based on soft data reads), the reliability data can be assigned to the codeword based, at least in part, on the soft data (e.g., the input to the iterative error correction circuit 112 will include reliability data, unlike the hard read case). The codeword can be updated during each layer (or some multiple of the layers, or once per iteration, for example) of decoding (e.g., the iterative error correction circuit 112 can update the input reliability data based on the parity check constraints of the LDPC code). Each layer of an iteration can include receiving an input from less than all (e.g., a respective one) of the check nodes and updating the reliability data based, at least in part (e.g., in some embodiments, based only), on the input (e.g., updated reliability data) from the respective one of the check nodes. Some embodiments can include updating the reliability data every L-number (e.g., where L is a variable from 1 layer to all layers, where the reliability data can be updated every layer, every other layer, every third layer, and so on, up to once per iteration) of the number of layers. The reliability data can be updated based on the input from the respective ones of the check nodes coupled thereto. In a number of embodiments, the layered updating can proceed until the variable node has received an input from each of the check nodes coupled thereto. The layered updating of the stored reliability data value at the variable node for all of the number of check nodes coupled thereto can be completed for one iteration before sending a subsequent (updated) reliability data value from the variable node to each of the check nodes coupled thereto.

The iterative error correction circuit 112 can transfer the codeword or a copy thereof to the algebraic error correction circuit 114 in response to the layered parity check being correct for a particular layer. In some embodiments, the iterative error correction circuit 112 can stop error correcting the codeword in response to the layered parity check being correct for a particular layer or in response to the layered parity check being correct for the particular layer and at least one other layer. In a number of embodiments, the layered parity check can be considered to be correct when there are no parity errors in the particular layer, or in some embodiments, in the particular layer and at least one other layer, (where the parity check is correct for all units of data checked in the particular layer and/or at least one other layer). In some embodiments, the layered parity check is correct when there are less than a threshold number of parity errors in the particular layer, or in some embodiments, in the particular layer and at least one other layer. For example, the threshold number of parity errors can be selected based on the correction capability of the algebraic error correction circuit 114. In a number of embodiments, the controller 108 can be configured to select the threshold number of errors based on a number of characteristics of the memory device 110, such as a temporal age of the memory device 110, a number of program/erase cycles of the memory device 110, a storage density of the memory device 110, a retention rate of the memory device 110 (e.g., how long programmed memory cells can retain a charge), and/or a physical location within the memory device 110 where the codeword is stored (e.g., whether the codeword, or a portion thereof is stored on an edge word line), among other characteristics of the memory device 110. In some embodiments, the threshold number of parity errors can be defined in firmware of the controller 108 as a selectable option.

In some embodiments, the iterative error correction circuit 112 can error correct the codeword until the codeword includes less than a threshold number of parity errors in a particular layer of a particular iteration. According to a number of embodiments, a concatenated coding scheme can be employed such that the algebraic error correction circuit 114 can receive the updated codeword from the iterative error correction circuit 112 (e.g., after the codeword includes less than a threshold number of parity errors in a particular layer). Then the algebraic error correction circuit 114 can error correct the codeword according to its algebraic error correction code constraints. The algebraic error correction circuit 114 can be configured to transfer the codeword or a copy thereof to the host interface 106 (and the host interface can be configured to receive the codeword) in response to a successful error correction by the algebraic error correction circuit. The controller 108 can be configured to indicate a successful program verify operation in response to a successful error correction by the algebraic error correction circuit. In the event that the error correction by the algebraic error correction circuit 114 is unsuccessful, the iterative error correction circuit 112 can be configured to receive soft data from the memory device 110 (e.g., from a soft read of the memory or from a buffer that stores previously read soft data) in response to the unsuccessful error correction by the algebraic error correction circuit 114 (e.g., the controller 108 can initiate a soft read and/or request soft data that was previously read along with the hard data).

In a number of embodiments, the iterative error correction circuit 112 can be iterated only once for a received codeword comprising hard data and then the codeword can be transferred to the algebraic error correction circuit 114 for any remaining error correction not accomplished by the iterative error correction circuit 112. If the concatenated scheme is insufficient to correct the codeword, soft data can be retrieved from the memory device 110 and the iterative error correction circuit 112 can be iterated as many times as necessary to correct the codeword or, up to a predetermined threshold number of iterations.

The iterative error correction circuit 112 can deliver increased performance over a number of iterations (e.g., iterations of a normalized-min-sum or other iterative decoding algorithm). An iteration of an iterative error correction circuit 112 can be equivalent to going over all parities and updating the codeword (e.g., hard decisions). However, the amount of power consumed by the iterative error correction circuit 112 is directly proportional to the number of iterations performed. Given the stringent power budget of some memory systems (e.g., systems employing flash memory such as in portable electronic devices), a number of embodiments of the present disclosure stop the iterative error correction circuit 112 prior to completing all iterations, or even prior to completing a particular iteration. Furthermore, a concatenated coding scheme is employed that uses both the iterative error correction circuit 112 (e.g., providing an inner code) and the algebraic error correction circuit 114 (e.g., providing an outer code). Given that the iterative error correction circuit 112 and the algebraic error correction circuit 114 both work to correct a codeword, stopping the iterative error correction circuit 112 as soon as the remaining errors are suspected to be within the correction capability of the algebraic error correction circuit 114 can be beneficial in terms of power savings. Error correction of the codeword can begin with the algebraic error correction circuit in response to stopping iterative error correction with the iterative error correction circuit (e.g., when a particular layer has less than a threshold number of parity errors). However, in a number of embodiments, the iterative error correction circuit can continue to iteratively error correct the codeword while the algebraic error correction circuit operates on (e.g., corrects) the codeword. In such embodiments, the iterative error correction circuit can be stopped in response to the second error correction circuit reporting an uncorrectable error for the codeword. By way of example, the iterative error correction circuit 112 can comprise an LDPC decoder that employs a layered min-sum decoding algorithm, where a layer can be considered a fraction of an iteration at which each LDPC codeword bit is updated based on a single parity check. If such a layer results in no parity errors (or a less than a threshold number of parity errors), an assumption can be made that the codeword will be within an error correction capability of the algebraic error correction circuit 114.

Figure 2:
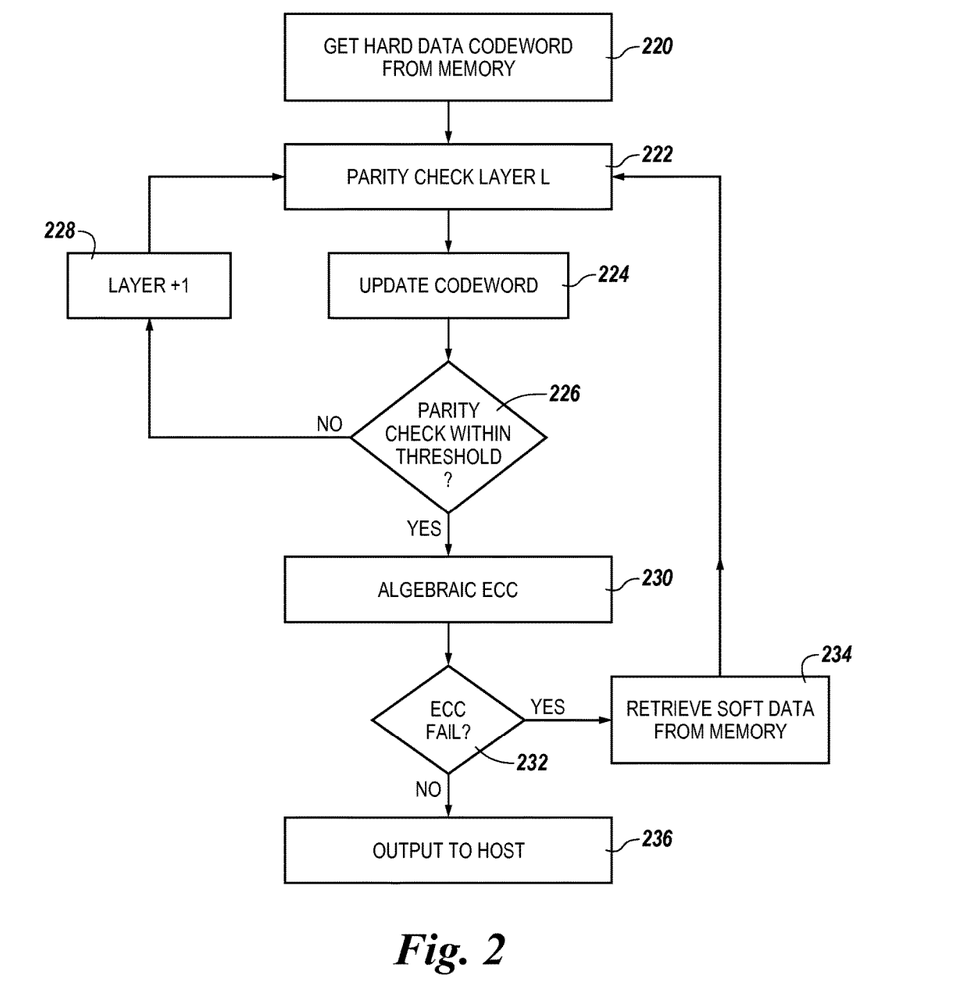
FIG. 2 illustrates a flow diagram for stopping layered iterative error correction in accordance with a number of embodiments of the present disclosure.

FIG. 2 illustrates a flow diagram for stopping layered iterative error correction in accordance with a number of embodiments of the present disclosure. At 220, a codeword comprising hard data can be received from a memory device (e.g., memory device 110 illustrated in FIG. 1). At 222, error correction can be performed on the codeword (e.g., with an iterative error correction circuit 112 illustrated in FIG. 1). For example, iterative error correction can be performed on the codeword on a layer-by-layer basis. After layer "L", the codeword can be updated as illustrated at 224. After each layer of error correction, the iterative error correction circuit can be aware of the number of parity errors in that layer. At 226, if the number of parity errors is within a parity check threshold (e.g., selected based on the correction capability of an algebraic error correction circuit), then the iterative error correction can be stopped (without checking a next layer of the iteration) and the codeword can be transferred to a different error correction circuit (to the algebraic error correction circuit) at 230. At 226, if the number of parity errors is not within a parity check threshold, then a next layer of the error correction iteration can be performed as illustrated at 228 and 222. Although not specifically illustrated in FIG. 2, the iterative error correction can be stopped in response to a threshold number of iterations being completed (regardless of whether the parity check is correct for a last layer of a last iteration of error correction).

At 232, after the algebraic error correction circuit has error corrected the codeword, a determination can be made as to whether the codeword passed or failed the algebraic error correction. If the algebraic error correction failed, at 234, soft data corresponding to the codeword can be retrieved from the memory device and iterative error correction can begin for the codeword taking into account the soft data at 222. In a number of embodiments of the present disclosure, soft data can be received from the memory device in response to failed error corrections by the first (e.g., the iterative error correction circuit) and the second (e.g., the algebraic error correction circuit) error correction circuits. The algebraic error correction circuit can correct up to a threshold number of errors (e.g., bit or symbol errors). Although not specifically illustrated in FIG. 2, the algebraic error correction circuit can report an uncorrectable error in response to a number of errors in the codeword exceeding a threshold number of errors correctable by the algebraic error correction circuit. If the algebraic error correction succeeded, at 236, the codeword can be output to the host. The codeword can be transferred to the host in response to successful error corrections by the first and the second error correction circuits.

Figure 3:
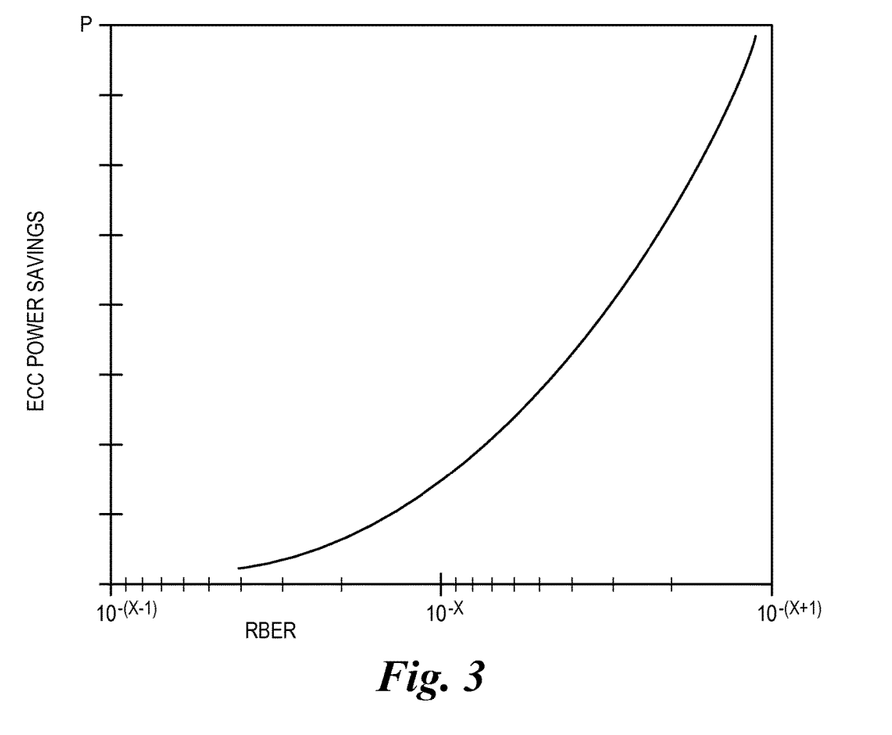
FIG. 3 is a plot illustrating error correction circuitry (ECC) power savings versus raw bit error rate (RBER) according to a number of embodiments of the present disclosure.

FIG. 3 is a plot illustrating error correction circuitry (ECC) power savings versus raw bit error rate (RBER) according to a number of embodiments of the present disclosure. The ECC power savings is represented from 0 to P where P is indicative of a percentage of power savings (not necessarily 100%). The RBER is represented from $10^{-(x-1)}$ to $10^{-(x+1)}$, where x represents a positive integer. The RBER closer to the right of the graph can be representative of a typical RBER at the beginning of life for a typical memory device. As is illustrated, the power savings can diminish with increased raw bit error rate (trending toward the left side of the graph). The curve represents experimental data indicating the power savings for an iterative error correction circuit according to a number of embodiments of the present disclosure.

Figure 4:
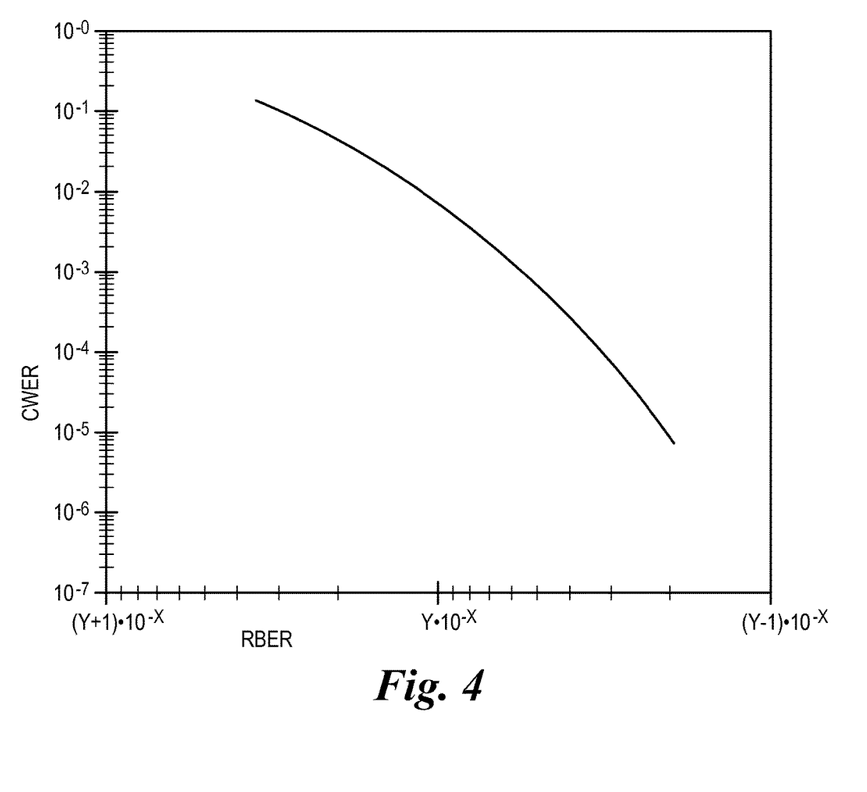
FIG. 4 is a plot illustrating codeword error rate (CWER) versus raw bit error rate (RBER) according to a number of embodiments of the present disclosure.

FIG. 4 is a plot illustrating codeword error rate (CWER) versus raw bit error rate (RBER) according to a number of embodiments of the present disclosure. The CWER is represented from $10^{-7}$ to $10^0$. The RBER is represented from $(y+1)*10^{-(x-1)}$ to $(y-1)10^{-(x+1)}$, where x and y each represent positive integers. The value of x in FIG. 4 is not necessarily the same as the value of x in FIG. 3. Although not distinguishable in FIG. 4, two curves are actually shown. A first curve represents the codeword failure rate when the iterative error correction circuit is stopped according to a number of embodiments of the present disclosure and a second curve (essentially collinear with the first curve)

represents the codeword failure rate according to some previous approaches that do not stop the iterative error correction circuit prior to the completion of a number of iterations according to known algorithms (e.g., the iterative error correction circuit is not stopped early). Thus, as illustrated in FIG. 3 and FIG. 4, a number of embodiments of the present disclosure can decrease the power consumption of an iterative error correction circuit (e.g., in a concatenated error correction scheme) without increasing the codeword failure rate.

CONCLUSION

The present disclosure includes apparatuses and methods related to stopping criteria for layered iterative error correction. A number of methods can include receiving a codeword with an error correction circuit, iteratively error correcting the codeword with the error correction circuit including parity checking the codeword on a layer-by-layer basis and updating the codeword after each layer. Methods can include stopping the iterative error correction in response to a parity check being correct for a particular layer.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving a codeword with an error correction circuit;
   iteratively error correcting the codeword with the error correction circuit including:
      parity checking the codeword on a layer-by-layer basis; and
      updating the codeword after each layer;
   stopping the iterative error correction in response to a parity check being correct for a particular layer of a particular iteration within a threshold number of units of data without error correcting a next layer of the particular iteration, wherein the threshold number of units of data is at least one; and
   selecting the threshold number based on a characteristic of an apparatus, the apparatus including the error correction circuit, selected from the group of characteristics including: a temporal age of the apparatus, a number of program/erase cycles of the apparatus, a storage density of the apparatus, a retention rate of the apparatus, and a physical location within the apparatus where the codeword is stored.

2. The method of claim 1, wherein stopping the iterative error correction comprises stopping the iterative error correction in response to the parity check being correct for the particular layer for all units of data.

3. The method of claim 1, wherein the method includes transferring the codeword to a different error correction circuit after stopping the iterative error correction.

4. The method of claim 3, wherein iteratively error correcting the codeword with the error correction circuit comprises using a quasi-cyclic low density parity check code to error correct the codeword; and
   wherein the method includes using an algebraic code to error correct the codeword with the different error correction circuit.

5. The method of claim 1, wherein stopping the iterative error correction comprises stopping the iterative error correction in response to the parity check being correct for the particular layer and at least one other layer.

6. The method of claim 5, wherein stopping the iterative error correction comprises stopping the iterative error correction in response to the parity check being correct for the particular layer and the at least one other layer within the threshold number of units of data.

7. The method of claim 5, wherein stopping the iterative error correction comprises stopping the iterative error correction in response to the parity check being correct for the particular layer and the at least one other layer for all units of data.

8. A method, comprising:
   receiving a codeword with a first error correction circuit;
   iteratively error correcting the codeword on a layer-by-layer basis with the first error correction circuit;
   updating the codeword after each layer with the first error correction circuit; and
   transferring the codeword to a second error correction circuit in response to a parity check being correct for a particular layer within a threshold number of units of data, wherein the particular layer is a layer other than a last layer of an iteration, and wherein the threshold number of units of data is at least one; and
   selecting the threshold number based on a characteristic of an apparatus, the apparatus including the first error correction circuit and the second error correction circuit, selected from the group of characteristics including: a temporal age of the apparatus, a number of program/erase cycles of the apparatus, a storage density of the apparatus, a retention rate of the apparatus, and a physical location within the apparatus where the codeword is stored.

9. The method of claim 8, wherein the method includes transferring the codeword to the second error correction circuit in response to a threshold number of iterations being completed regardless of whether a parity check is correct for a last layer of a last iteration.

10. The method of claim 9, wherein transferring the codeword comprises transferring a copy of the codeword; and
   wherein the method includes continuing iteratively error correcting the codeword with the first error correction circuit while the second error correction circuit operates on the codeword.

11. The method of claim 10, wherein the method includes stopping the iterative error correction with the first error correction circuit in response to the second error correction circuit reporting an uncorrectable error for the codeword.

12. The method of claim 9, wherein the method includes:
correcting up to a threshold number of errors in the codeword with the second error correction circuit; and
reporting an uncorrectable error in response to the number of errors in the codeword exceeding the threshold.

13. The method of claim 12, wherein the method includes:
using a quasi-cyclic low density parity check code to error correct the codeword with the first error correction circuit; and
using an algebraic code to error correct the codeword with the second error correction circuit.

14. A method, comprising:
receiving a codeword comprising hard data from a memory device;
iteratively error correcting the codeword on a layer-by-layer basis with a first error correction circuit until the codeword includes less than a threshold number of parity errors in a particular layer, wherein the particular layer is a layer other than a last layer of an iteration, and wherein the threshold number of parity errors is at least two;
error correcting the codeword with a second error correction circuit;
receiving soft data from the memory device in response to failed error corrections by the first and the second error correction circuits; and
selecting the threshold number based on a characteristic of an apparatus, the apparatus including the first error correction circuit and the second error correction circuit, selected from the group of characteristics including: a temporal age of the apparatus, a number of program/erase cycles of the apparatus, a storage density of the apparatus, a retention rate of the apparatus, and a physical location within the apparatus where the codeword is stored.

15. The method of claim 14, wherein the method includes transferring the codeword from the first error correction circuit to the second error correction circuit in response to the codeword including less than the threshold number of parity errors in the particular layer.

16. The method of claim 14, wherein the method includes transferring the codeword from the second error correction circuit to a host in response to successful error corrections by the first and the second error correction circuits.

17. The method of claim 14, wherein the method includes indicating a successful program verify operation in response to successful error corrections by the first and the second error correction circuits.

18. The method of claim 14, wherein the method includes beginning error correcting the codeword with the second error correction circuit in response to stopping the iterative error correction with the first error correction circuit.

19. The method of claim 18, wherein the method includes:
using a quasi-cyclic low density parity check code with the first error correction circuit; and
using an algebraic code with the second error correction circuit.

20. An apparatus, comprising:
an iterative error correction circuit configured to:
iteratively error correct a codeword on a layer-by-layer basis;
update the codeword after each layer; and
transfer the codeword to an algebraic error correction circuit in response to a parity check being correct for a particular layer, wherein the particular layer is a layer other than a last layer of an iteration, wherein the iterative parity check is correct when there are less than a threshold number of parity errors in the particular layer, and wherein the threshold number of parity errors is at least two;
wherein the apparatus is configured to select the threshold number based on a characteristic of the apparatus selected from the group of characteristics including: a temporal age of the apparatus, a number of program/erase cycles of the apparatus, a storage density of the apparatus, a retention rate of the apparatus, and a physical location within the apparatus where the codeword is stored.

21. The apparatus of claim 20, wherein the threshold number is selected based on a number of errors correctable by the algebraic error correction circuit.

22. The apparatus of claim 20, wherein the threshold number of parity errors is a selectable option in firmware of the apparatus.

23. The apparatus of claim 20, wherein the iterative error correction circuit comprises a quasi-cyclic low density parity check code circuit.

24. An apparatus, comprising:
a memory device;
a first correction circuit coupled to the memory device, wherein the first error correction circuit is configured to:
receive a codeword comprising hard data from the memory device; and
iteratively error correct the codeword on a layer-by-layer basis until the codeword includes less than a threshold number of parity errors in a particular layer of a particular iteration, wherein the particular layer is a layer other than a last layer of an iteration, and wherein the threshold number of parity errors is at least two;
a second error correction circuit coupled to the first error correction circuit, wherein the second error correction circuit is configured to:
receive the codeword from the first error correction circuit after the codeword includes less than the threshold number of parity errors in the particular layer; and
error correct the codeword; and
a host interface coupled to the second error correction circuit, wherein the host interface is configured to receive the codeword in response to successful error correction by the second error correction circuit;
wherein the apparatus is configured to select the threshold number based on a characteristic of the apparatus selected from the group of characteristics including: a temporal age of the apparatus, a number of program/erase cycles of the apparatus, a storage density of the apparatus, a retention rate of the apparatus, and a physical location within the apparatus where the codeword is stored.

25. The apparatus of claim 24, wherein the first error correction circuit is configured to receive soft data from the memory device in response to unsuccessful error correction by the second error correction circuit.

26. The apparatus of claim 24, wherein the apparatus includes firmware that provides a selectable option to define the threshold number of parity errors.

27. The apparatus of claim 24, wherein the first error correction circuit comprises a quasi-cyclic low density parity check (LDPC) code circuit and the second error correction circuit comprises an algebraic error correction circuit.

28. The apparatus of claim 27, wherein the algebraic error correction circuit comprises one of the group including a Bose-Chaudhuri-Hocquenghem (BCH) error correction circuit, and a Reed Solomon error correction circuit.

* * * * *